May 8, 1956 JEAN-MARIE MOULON 2,745,009

HIGH STABILITY TRANSISTOR OSCILLATOR

Filed Feb. 26, 1954 2 Sheets-Sheet 1

May 8, 1956 JEAN-MARIE MOULON 2,745,009

HIGH STABILITY TRANSISTOR OSCILLATOR

Filed Feb. 26, 1954 2 Sheets-Sheet 2

2,745,009

HIGH STABILITY TRANSISTOR OSCILLATOR

Jean-Marie Moulon, Paris, France

Application February 26, 1954, Serial No. 412,673
Claims priority, application France March 28, 1953
2 Claims. (Cl. 250—36)

The present invention relates to a "crystal triode" or "transistor" oscillator having a high stability of operating frequency regardless of changes in power supply current and/or temperature or when its active elements and particularly its transistor elements are changed.

The oscillator includes a resonant circuit and a negative resistance consisting of a transistor amplifier and a network of passive impedances coupling the input and output of the amplifier and forming two feedback paths, the one positive and the other negative, the one being of the series type and the other of the shunt type. Such a negative resistance has been described in my copending patent application, Serial No. 378,128 filed on September 2, 1953, for "Negative Impedance Device."

A high stability transistor oscillator according to the present invention comprises, in combination, a series-connected resonant circuit including an inductance and a condenser, a transistor amplifier having an input circuit and an output circuit, a passive impedance network coupling said circuits and provided with a first pair and a second pair of accessible terminals, said network providing both a negative feedback path and a positive feedback path between said input and output circuits, and said pairs of terminals being so arranged that when a passive impedance is connected across one of said pairs of terminals the algebraic sign of the total feedback applied to said amplifier is reversed according to whether a zero or infinite impedance is connected across the other of said pairs of terminals, said series-connected resonant circuit being connected across one of said pairs of terminals, and a passive impedance connected across the other of said pairs of terminals. The invention having been briefly defined will now be described in greater detail with reference to the appended drawings, wherein:

Figure 1:
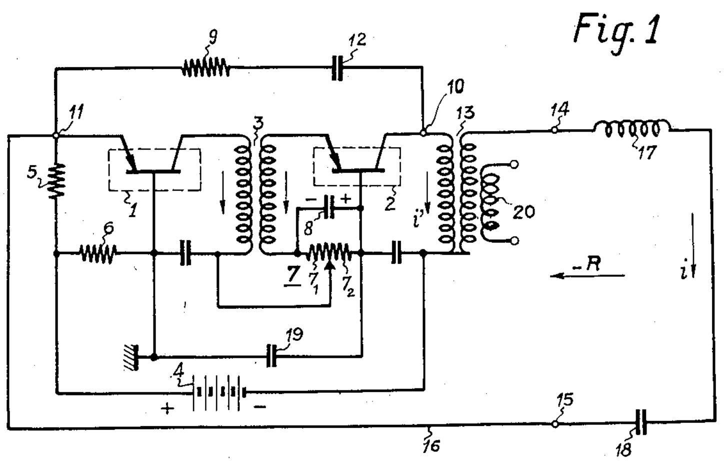
Figure 1 shows, diagrammatically, an oscillator according to the invention.

Referring to Figure 1, the negative resistance is of the type described in the above mentioned copending patent application. In said patent application, it was shown that a negative impedance may be constituted by an amplifier of any type, in particular of the transistor type, provided its gain is high enough, and by a network of passive impedances coupling the input and output of the amplifier and comprising two feedback paths such that, for one end at least of the amplifier, one feedback is of the series type while the other is of the shunt type, one of said feedbacks being positive and the other being negative. Two pairs of terminals are selected in the network, so that there is no feedback when these two pairs of terminals are open, but if a passive impedance is connected to any one of the pair of terminals, short-circuiting or opening the other has the effect of changing the algebraic sign of the total feedback applied to the amplifier. When a passive impedance is connected to one of these terminal pairs, a negative impedance is thus available on the other pair of terminals.

In the diagram of Figure 1, the negative resistance comprises the two transistors 1 and 2 coupled by a transformer 3 wound with such a relative direction of its primary and secondary windings, that to a current issuing from the collector electrode of transistor 1, there corresponds a current issuing from the emitter electrode in transistor 2. Such a transformer is called a "phase-inverting" transformer. The two transistors are power supplied in series by the current source 4. The emitter electrode of transistor 1 is biassed by means of resistances 5 and 6 and the emitter electrode of transistor 2 is biassed by means of the potentiometer 7 shunted by the condenser 8. This condenser has a negligible reactance at the oscillation frequency of the oscillator. The resistance 9, inserted between the terminals 10 and 11 constitutes a negative feedback path of the shunt type. The condenser 12, in series with the resistance 9, is for the purpose of keeping the direct current used for power supply out of the feedback path.

The output transformer 13 is also a phase-inverting transformer. A negative resistance —R is thus seen between the terminal 14 of the secondary winding of the transformer 13 and the end 15 of a connection 16 connected, at its other end, with the terminal 11. As discussed in the above mentioned patent application, this negative resistance depends only on the value of the resistance 9 and on the ratio of transformation of the output transformer 13.

A negative resistance of the type just described is known per se. For example, reference is made to Figure 6 in the above mentioned copending patent application.

Terminals 14 and 15, between which the negative resistance is seen, are connected with a series resonant circuit comprised of an inductance 17 and a condenser 18. The oscillator constituted by said resonant circuit and negative resistance oscillates at the tuning frequency of the resonant circuit. The oscillation might be taken at the terminals of a coil coupled with the inductance 17. But, in order not to damp too much the resonant circuit 17—18 by such a coupling, it is preferred to tap off the oscillation at the terminals of a third winding 20 of the transformer 13. As will be seen hereinafter, the oscillation thus tapped off is not sinusoidal and it has to be filtered before being applied to the circuits for its utilization.

Figure 2:
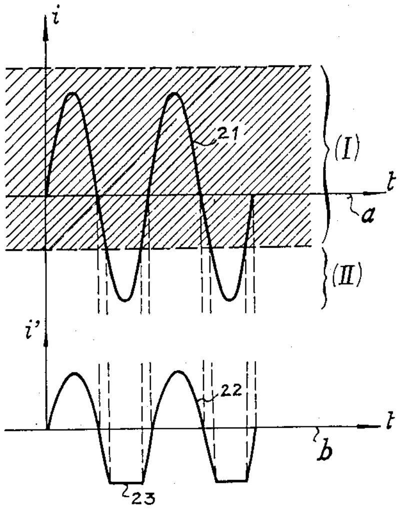
Figure 2 is a diagram, as a function of time, on the one hand, of the current through the resonant circuit and on the other hand, of the current through the output stage of the amplifier which is part of the negative resistance.

The curve showing the current *i* as a function of time *t* in the resonant circuit is represented at 21 in Figure 2, line *a*. This curve includes two ranges. The shaded range (I) corresponds to the range for the linear operation of the amplifier. In that range, the power supply source supplies energy to the resonant circuit for compensating the damping thereof. In the non-shaded range (II) the resonant circuit oscillates freely.

The output current *i'*, from the amplifier, has the wave shape shown at 22 in Figure 2, line *b*. In the portion 23 of the signal, a saturation phenomenon is observed outside of the linear range of the amplifier.

Figure 3:
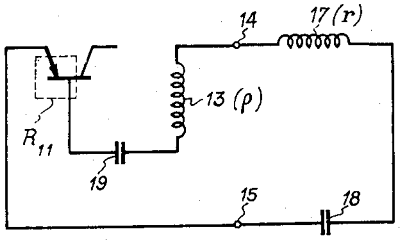
Figure 3 shows diagrammatically, the equivalent to the oscillator outside the linear range of the amplifier.

In the non-linear range of the amplifier, the resistance seen towards the left from the terminals 14 and 15 in Figure 1 becomes positive and is in series with the resonant circuit 17—18. The total resistance in the resonant circuit then includes the latter positive resistance and the resistance $r$ of inductance 17. The resistance connected with terminals 14—15 comprises (Figure 3), the input resistance $R_{11}$ of the transistor 1, the condenser 19, the capacity of which has been selected so that it has a negligible impedance at the oscillation frequency, and the resistance $\delta$ of the secondary winding of the transformer 13. The total of resistances $R_{11}$ and $\delta$ should be small as compared to resistance $r$. Consequently, for a given voltage magnification factor of the resonant circuit 17—18, there is an advantage in selecting an inductance with a not too small resistance of its own. An inductance successfully used for an oscillator operating at a frequency of 2000 C. P. S. had a resistance of 500 ohms for a voltage magnification factor (Q) of 30.

Finally, for decreasing the input resistance $R_{11}$ of the transistor 1, there is an advantage in biassing with a high current the emitter electrode thereof, since it is known that this resistance $R_{11}$ varies practically as the reciprocal of the biassing direct current for this emitter electrode. Values for the resistance 5, convenient for obtaining said high biassing, will be indicated hereinafter.

The amplifier ceases to be linear when the alternating currents applied thereto become too high. These currents are higher at the input to the second transistor 2 than at that of the first transistor 1, since they have already been amplified by said first transistor. Saturation, therefore, occurs in the second transistor and this saturation is caused by a locking of the diode consisting of the emitter electrode and base electrode of the second transistor, i. e. during all or part of the negative half-wave applied to the emitter electrode, the current in the collector electrode remains constant.

During the operation of the oscillator, the amplitude of oscillations builds up after the start, until it reaches and exceeds the saturation level. The resistance at terminals 14—15 of the resonant circuit becomes positive when the amplitude of oscillation reaches the saturation value, as stated above, and that amplitude stabilizes at a value which gives a zero magnitude, as an average, for the total resistance of the resonant circuit and for the circuit connected with the terminals 14—15 of the latter.

Self regulating of the frequency as a function of variations in the direct current for the amplifier power supply is obtained by the action of condenser 8 which charges when the current is increasing in the emitter electrode of transistor 2, but which cannot discharge entirely when the current in said emitter electrode is decreasing and reaches too considerable an amplitude, since the input impedance of the transistor 2, which is then locked, is very high, and since, further, the potentiometer 7 has a high resistance. Now, condenser 8 can discharge only through the input resistance of the transistor 2 or through the potentiometer 7. As a result, the condenser 8 takes an average charge which is not zero, and the terminal of that condenser connected with the emitter electrode of transistor 2 is all the more negative as the amplitude of oscillation reaches higher values, which decreases the mean biassing current for that electrode.

Figure 4:
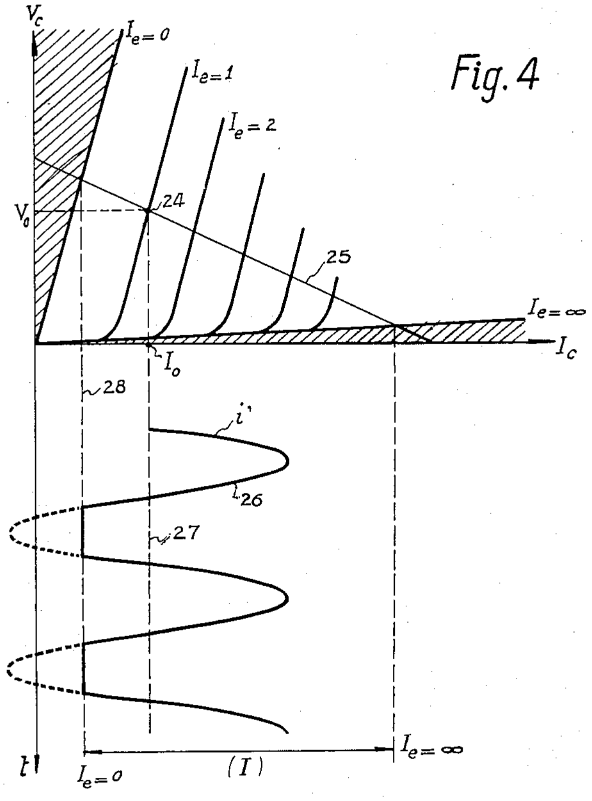
Figure 4 is a diagram showing a family of characteristics of the transistor in the output stage of the amplifier, to bring out in what manner the oscillator frequency remains substantially invariable in spite of the variations in the power supply current for the amplifier.

Figure 4 shows, in the case of transistor 2, the family of characteristic curves representing the voltage $V_c$ of the collector electrode as against the current $I_c$ for that same electrode, for various values of the current $I_e$ in the emitter electrode. The point 24, with the coordinates $V_0I_0$ corresponds to the normal biassing for transistor 2 and the straight line 25 is the charging line. Curve 26 represents the output signal from transistor 2. It is symmetrical with respect to the straight line 27, having an abscissa $I_0$, and it is clipped at the level 28 corresponding to the value of the current in the collector electrode at which the charge line 25 intersects the characteristic $I_e=0$.

When the biassing current increases, due to an increase in voltage of the source 4, the point 24 moves towards the right on the charge line 25 and the straight line 27 also moves toward the right. The clipping straight line 28 being fixed, the signal 26 is truncated to a lesser extent than previously, and the oscillation in the resonant circuit 17—18 tends to increase. The condenser 8 takes on a larger charge and the potential difference at its terminals has the effect of decreasing the biassing current for the transistor 2, which cancels the increase in this same current caused by the increase in voltage of source 4.

Figure 5:
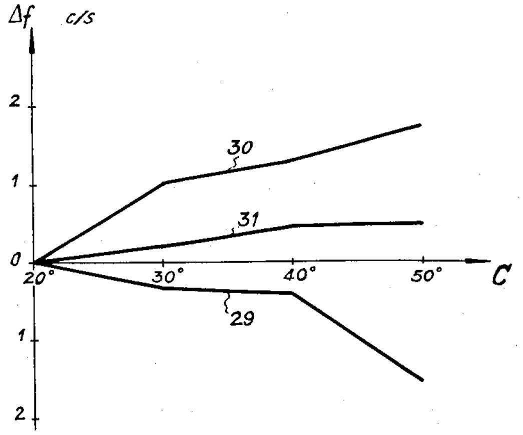
Figure 5 is a diagram showing the compensation of the frequency variations of the oscillator as a function of temperature.

In order to have biassing currents for the emitter electrodes which are nearly independent of the transistors used and which do not vary when a transistor is replaced in the amplifier, values should be taken, for the biassing resistances 5, 6, $7_1$ and $7_2$ ($7_1$ and $7_2$ are the portions of the potentiometer 7 located respectively to the left and right of the slide of said potentiometer), which are large as compared with the resistance $R_{11}$ of the emitter electrode-base electrode circuit measured when the collector electrode-base electrode circuit is open, and as compared with the resistance $R_{12}$ which expresses the action of the collector electrode-base electrode circuit on the emitter electrode-base electrode circuit. The resistances $R_{11}$ and $R_{12}$ are, respectively, for current transistor models, of the orders of 200 and 100 ohms. An oscillator having a frequency practically independent of the changing of transistors in its amplifier was built by the applicant taking:

Resistance 5=8,000 ohms
Resistance 6=2,000 ohms
Resistance $7_1$=10,000 ohms
Resistance $7_2$=2,000 ohms
Condenser 8=2 microfarads When the room temperature increases, the value of the inductance 17 of the resonant circuit increases, which tends to cause a lowering of the oscillation frequency. This drop in frequency is represented by the curve 29 of Figure 5 for the case when the inductance 17 is alone subjected to the temperature variation, the remainder of the oscillator being held at a constant temperature. The frequency drop $\Delta f$ is expressed in plotted against temperature.

The curve 30 shows the frequency variation observed when, the inductance 17 being held at a constant temperature, the amplifier and its feedback circuits are raised to increasing temperatures. While curve 29 is dropping, curve 30 is rising. The result is a compensating effect, and the frequency variation of the entire oscillator as a function of temperature is represented by the curve 31.

In the oscillator built by the applicant, the curve 31 is still slightly rising. It is possible, however, to obtain a better compensation by selecting for the inductance 17, an inductance having a relatively large temperature coefficient. Finally, the order of magnitude of the sensitivity of transistors to temperature is decreased by supplying the amplifier with constant current and not with a constant voltage. In the case of a constant voltage power supply, the resistance $R_{22}$, which represents the resistance of the collector electrode-base electrode circuit of the transistors when the emitter electrode-base electrode circuit is open, and the resistance $R_{21}$, which represents the action of the emitter electrode-base electrode circuit on the collector electrode-base electrode circuit, will both decrease with temperature and the power supply current would show a tendency to increase.

While the invention has been described with reference to a complete example of embodiment, detail changes are within the reach of one skilled in the art and it should be understood that these modifications are within the scope of the present invention.

What is claimed is:

1. A high stability transistor oscillator comprising, in combination, a two-stage transistor amplifier including a phase-inverting interstage transformer, a phase inverting output transformer and an input stage and an output stage transistor each having an emitter, a collector and a base electrode; a series-connected resonant circuit consisting of an inductance and a condenser connected between emitter electrode of said input stage transistor and one winding of said output transformer, the other winding of which is inserted in the collector circuit of said output stage transistor, a negative feedback connection consisting of an impedance connected between the emitter of said input transistor and the collector of said output transistor, a resistor connected in series in the base-electrode emitter circuit of said output stage transistor, a high capacity condenser connected across said resistor; said oscillator being further characterized in that said inductance has a positive temperature coefficient and in that the ohmic resistance of said inductance is higher than the sum of the input resistance of said input stage transistor and of the resistance of said one winding of said output transformer.

2. An oscillator as claimed in claim 1, wherein both said input and output stage transistors are biased from a common direct-current source connected between emitter circuit of said input stage transistor and collector circuit of said output stage transistor, wherein said resistor consists of the total resistance of a voltage divider made of two series-connected resistances, and wherein the collector of circuit of said input stage transistor is direct-current fed through a connection from latter said collector circuit to the point common to said series-connected resistances.

References Cited in the file of this patent

UNITED STATES PATENTS

| | | |
|---|---|---|
| 2,173,427 | Scott | Sept. 19, 1939 |
| 2,303,862 | Peterson | Dec. 1, 1942 |
| 2,681,996 | Wallace | June 22, 1954 |